United States Patent [19]

Leupold

[11] Patent Number: 5,523,732
[45] Date of Patent: Jun. 4, 1996

[54] MULTI-MODE ADJUSTABLE MAGIC RING

[75] Inventor: Herbert A. Leupold, Eatontown, N.J.

[73] Assignee: The United States of America as represented by the Secretary of the Army, Washington, D.C.

[21] Appl. No.: 543,735

[22] Filed: Oct. 16, 1995

[51] Int. Cl.$^6$ ........................................... H01F 7/02
[52] U.S. Cl. ............................................. 335/306; 335/298
[58] Field of Search ........................... 335/302–306, 335/298; 324/318–320

[56] References Cited

U.S. PATENT DOCUMENTS

| | | |
|---|---|---|
| 4,538,130 | 8/1985 | Gluckstern et al. ............... 335/306 |
| 4,639,673 | 1/1987 | Zijlstra ............................. 324/319 |
| 4,758,813 | 7/1988 | Holsinger et al. ................ 335/306 |
| 4,837,542 | 6/1989 | Leupold. |
| 4,862,128 | 8/1989 | Leupold. |
| 5,216,401 | 6/1993 | Leupold. |
| 5,237,301 | 8/1993 | Unkelbach et al. ............... 335/306 |

Primary Examiner—Gerald P. Tolin
Assistant Examiner—Raymond M. Barrera
Attorney, Agent, or Firm—Michael Zelenka; William H. Anderson; James A. DiGiorgio

[57] ABSTRACT

A permanent magnet structure providing an internal magnetic field having an adjustable magnitude and direction. The structure utilizes a shell composed of a predetermined number of concentric permanent magnet cylinders, each of which generates a discrete tunable magnetic field for tuning the magnitude and direction of the internal working field. Depending on the magnitude and direction of each discrete magnetic field, the magnitude and direction of the working field can be controlled and adjusted as desired.

6 Claims, 5 Drawing Sheets

FIG. 1
(Prior Art)
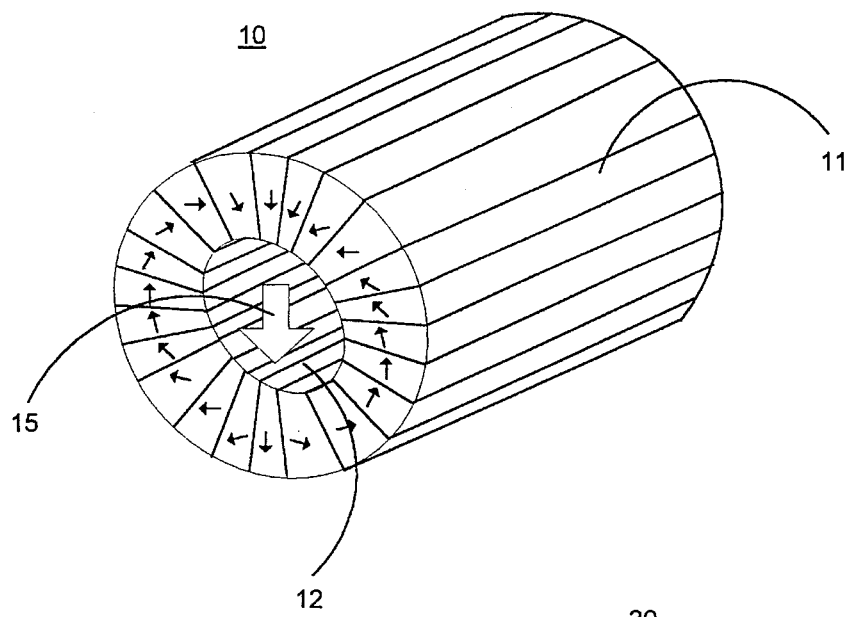
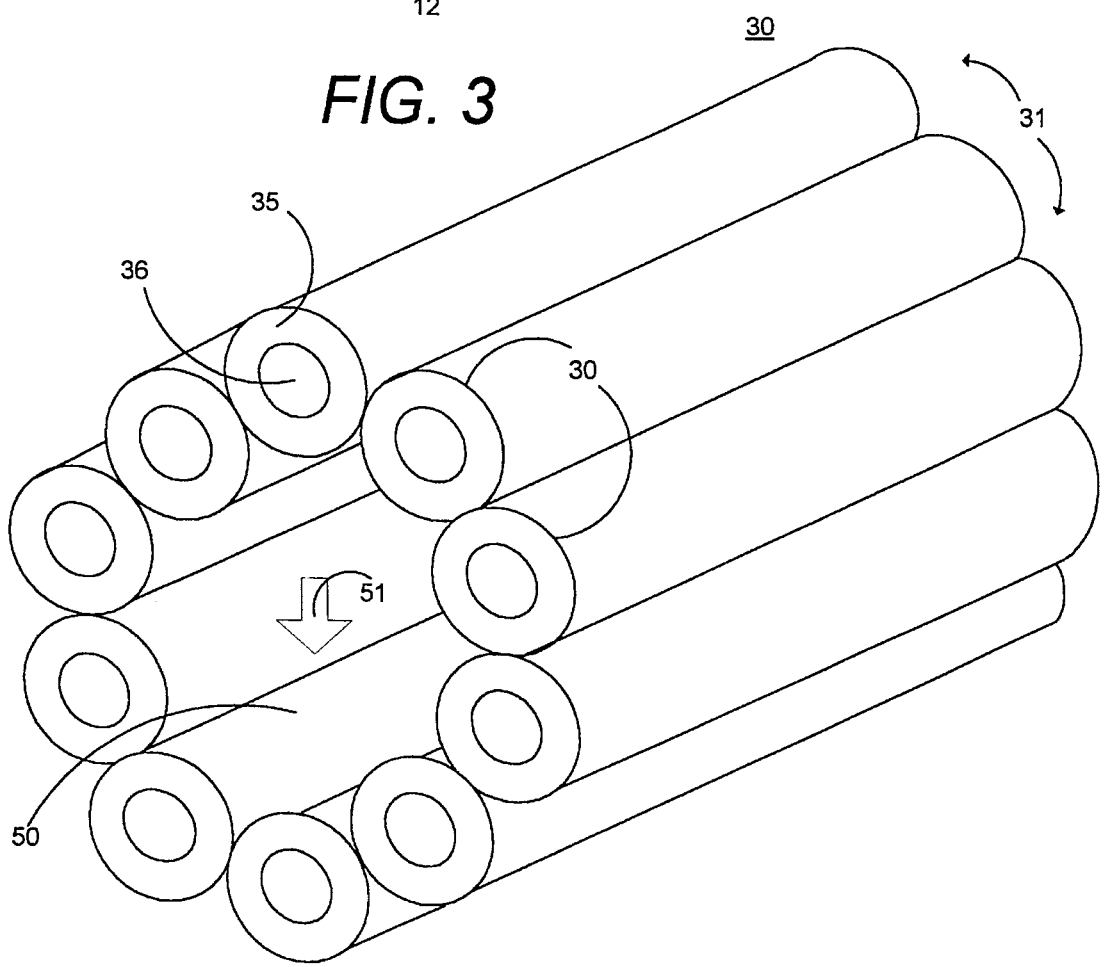
FIG. 3

MULTI-MODE ADJUSTABLE MAGIC RING

GOVERNMENT INTEREST

The invention described herein may be manufactured, used, and licensed by or for the Government for governmental purposes without the payment to me of any royalties thereon.

FIELD OF INVENTION

The invention relates to high-field permanent magnets. More specifically, this invention relates to permanent magnet structures that provide internal uniform magnetic fields.

BACKGROUND OF THE INVENTION

Heretofore, several permanent magnet structures have been designed to provide internal uniform magnetic fields of relatively high magnitude. The following references, which are hereby incorporated herein, describe some of the existing magnetic structures that provide such fields: (1) U.S. Pat. No. 5,216,401, entitled "Magnetic Field Sources Having Non-Distorting Access Ports," issued Jun. 1, 1993, to Leupold; and (2) U.S. Pat. No. 4,837,542, entitled "Hollow Substantially Hemispherical Permanent Magnet High-Field Flux Source For Producing A Uniform High Field," issued Jun. 6, 1989, to Leupold.

These reference patents describe structures composed of permanent magnet shells that form an internal cavity within which a uniform magnetic field is generated. The strength and direction of the internal uniform magnetic field directly depends on the thickness, remanence and direction of magnetization of the permanent magnet shell material. As a result, a variety of different permanent magnet shells, each having its own shape, thickness, remanence and direction of magnetization, have been designed.

For example, in U.S. Pat. No. 5,216,401 issued to Leupold, a magic ring was described. As shown, the magic ring has a permanent magnet shell composed of a plurality of similarly shaped permanent magnet segments that are assembled to form a cylindrical shell with a concentric cylindrical cavity. Although the permanent magnet segments are similarly shaped, they do not have the same direction of magnetization. More specifically, the direction of magnetization of each segment varies as a function of the polar angle around the circumference of the shell. A shell having such a configuration generates a fixed uniform magnetic field within its internal cavity.

One serious drawback to this shell-segment configuration, however, is that the magnitude and direction of the internal magnetic field can not be changed once the shell is constructed. Thus, a separate magic ring must be built to accommodate each application requiring an internal field having a different direction or magnitude. As a result, these prior art structures are not very practical or desirable for many such applications.

One solution to this problem was disclosed in U.S. Pat. No. 4,862,128, entitled "Field Adjustable Transverse Flux Source", issued to Leupold on Aug. 29, 1989, also incorporated herein. Leupold '128 describes a permanent magnet structure wherein the internal working field can be varied continuously from zero to a maximum field. More specifically, the magnetic structure comprises a plurality of hollow substantially cylindrical flux sources embedded within one another such that their longitudinal axis is aligned and the outer radius of the inner structure substantially equals the inner radius of the next structure. The cylindrical flux sources are constructed so that they can be rotated either clockwise or counterclockwise with respect to each other by any desired angle.

Such flux sources are characterized by their ability to add magnetic fields geometrically. Thus, the resultant working field in the center of their cavity is the vector sum of the magnetic fields independently generated by each embedded flux source. Moreover, there is no magnetic field generated external to the outermost cylinder of these structures. As a result, the structure provides an internal magnetic field having a magnitude that can be varied within a predetermined range which directly depends on the size, shape and magnetization of the individual permanent magnet pieces that comprise each embedded cylindrical flux source.

One drawback to this structure, however, is that each embedded cylinder is composed of many permanent magnet segments or wedges, each having a different magnetization. As a result, such cylinders require the assembly of many different permanent magnet pieces. Thus, although flux sources employing this embedded ring structure provide an adjustable internal working field, they are difficult and costly to make.

SUMMARY OF THE INVENTION

Accordingly, an object of the present invention is to provide a low-cost, easy to make permanent magnet structure that generates an adjustable or tunable uniform internal magnetic working field. To attain this, the present invention provides a permanent magnet structure having a shell composed of a plurality of tunable magnetic flux sources, each generating an adjustable or tunable discrete magnetic field that interact with each other to generate a magnetic working field within an internal cavity. As a result, the tunable flux sources control the magnitude and direction of the internal magnetic working field.

In general, each tunable magnetic flux source is composed of a plurality of rotatable, uniformly and transversely magnetized concentric cylindrical permanent magnets, each of which generates an external magnetic field. These external magnetic fields interact (i.e. vectorially add) with one another to generate the discrete magnetic field for their respective flux source. In addition, the cylinders of each flux source share a common longitudinal axis around which they can rotate to any desired angle. As a result, the cylinders of each flux source can be rotated to adjust the magnitude and direction of the discrete magnetic field of their respective flux source. Moreover, since the discrete fields of each flux source control the magnitude and direction of the internal working field of the structure, the cylindrical magnets of each flux source control the magnitude and direction of the internal working field. Consequently, the magnetic cylinders of any or all the flux sources can be rotated to tune the magnitude and direction of the internal working field, as desired, to a predetermined value.

In one embodiment of the invention, a magic ring structure can be created by placing a plurality of tunable magnetic flux sources side by side, at discrete locations, in a circular pattern such that they form a cylindrical internal cavity. In such a configuration, each discrete set of concentric cylinders can be adjusted, as desired, to generate a uniform internal working field having a predetermined magnitude and direction. As a result, the structure as described herein overcomes to a large extent the limitations of the prior-art.

These and other features of the invention are described in more complete detail in the following description of the preferred embodiment when taken with the drawings. The scope of the invention, however, is limited only by the claims appended hereto.

BRIEF DESCRIPTION OF THE DRAWINGS

FIG. 1 is a pictorial view of a prior-art magic ring having a shell composed of fixed permanent magnet pieces that generate a uniform internal magnetic field having a fixed direction and magnitude.

FIG. 3 is a side view of the embodiment shown in FIG. 2.

DETAILED DESCRIPTION OF THE INVENTION

Referring now to FIG. 1 there is shown a pictorial view of prior art magic ring 10. Magic ring 10 is composed of cylindrical permanent magnet shell 11 having internal cavity 12 within which uniform working field 15 is generated. As shown, working field 15 has a fixed magnitude and direction within cavity 12, and thus has limited use.

Figure 2:
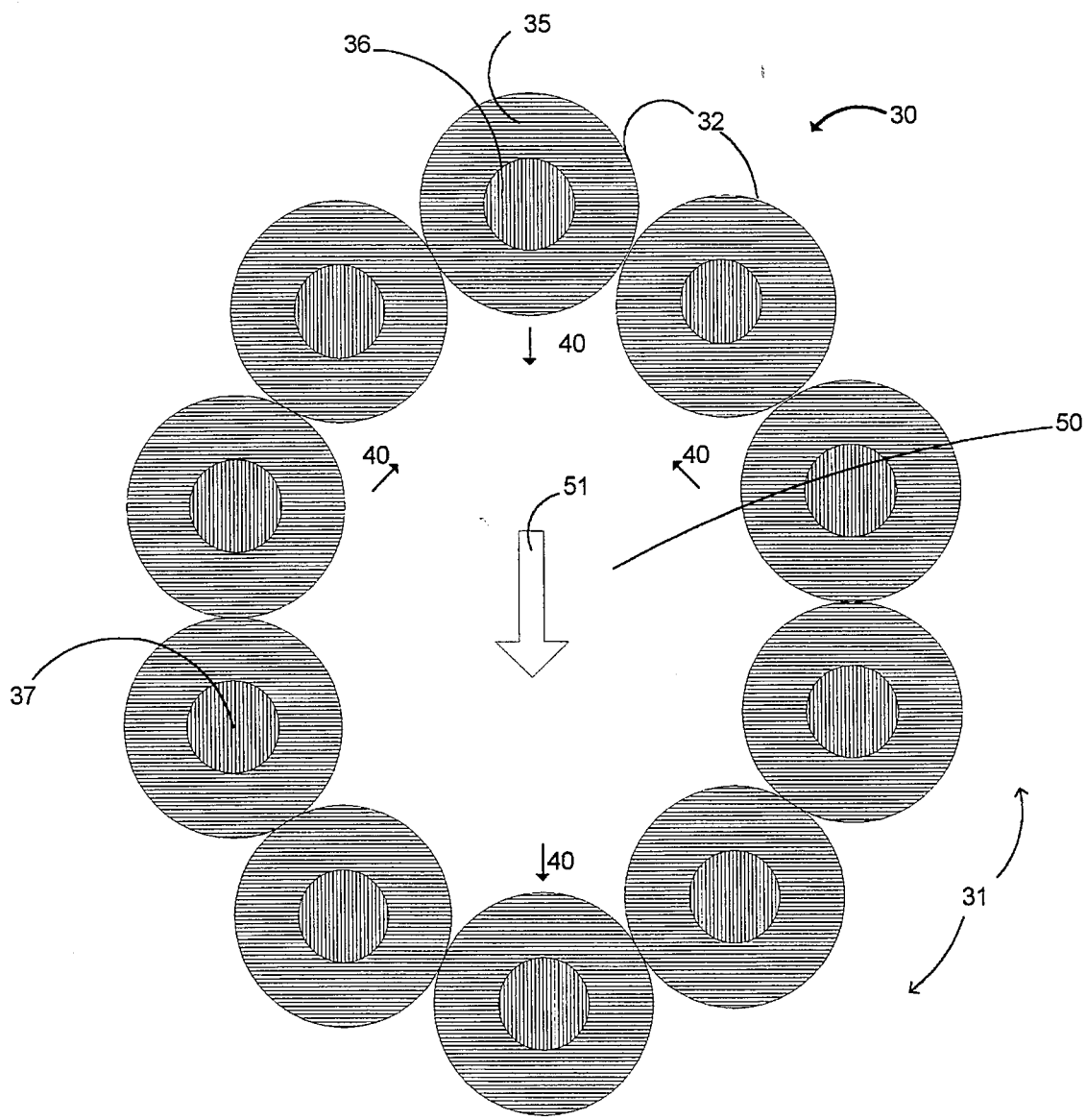
FIG. 2 is a cross-sectional view of one embodiment of the invention having a shell composed of rotatable permanent magnet cylinders that work together to provide a tunable internal working field.

Referring now to FIGS. 2 and 3, there is shown one embodiment of the present invention, magic ring 30. Magic ring 30 has shell 31 forming internal cavity 50 within which uniform working field 51 is located. Shell 31 is composed of a plurality of tunable magnetic flux sources 32 which work together to generate working field 51. Flux sources 32 are composed of concentric, transversely magnetized permanent magnet cylinders 35 and 36. Cylinders 35 and 36 are positioned with respect to each other such that they have common longitudinal axis 37, and are rotatable with respect to each other around common longitudinal axis 37.

Each concentric cylinder 35 an 36 of each flux source 32 generates an external magnetic field (not shown). The external fields (not shown) of each cylinder interact or vectorially add with on another to generate discrete magnetic field 40 of their respective flux source 32. As a result, the magnitude and direction of magnetization of cylinders 35 and 36 control the magnitude and direction of the discrete field 40 of their respective flux source 32. Moreover, the discrete magnetic fields 40 add vectorialy to each other to determine and set the magnitude and direction of internal working field 51. As a result, rotating any or all of cylinders 35 and 36 of each flux source adjusts or tunes the magnitude and direction of internal working field 51 within a predetermined range of values dependant on the magnetization of the cylinders.

In operation, rotating cylinders 35 and 36 of each flux source 32 tunes or sets the magnitude and direction of the internal working field 51 to a predetermined value within a predetermined range, wherein the range directly depends on the magnetization and rotatable position of each cylinder in each flux source.

Figure 4:
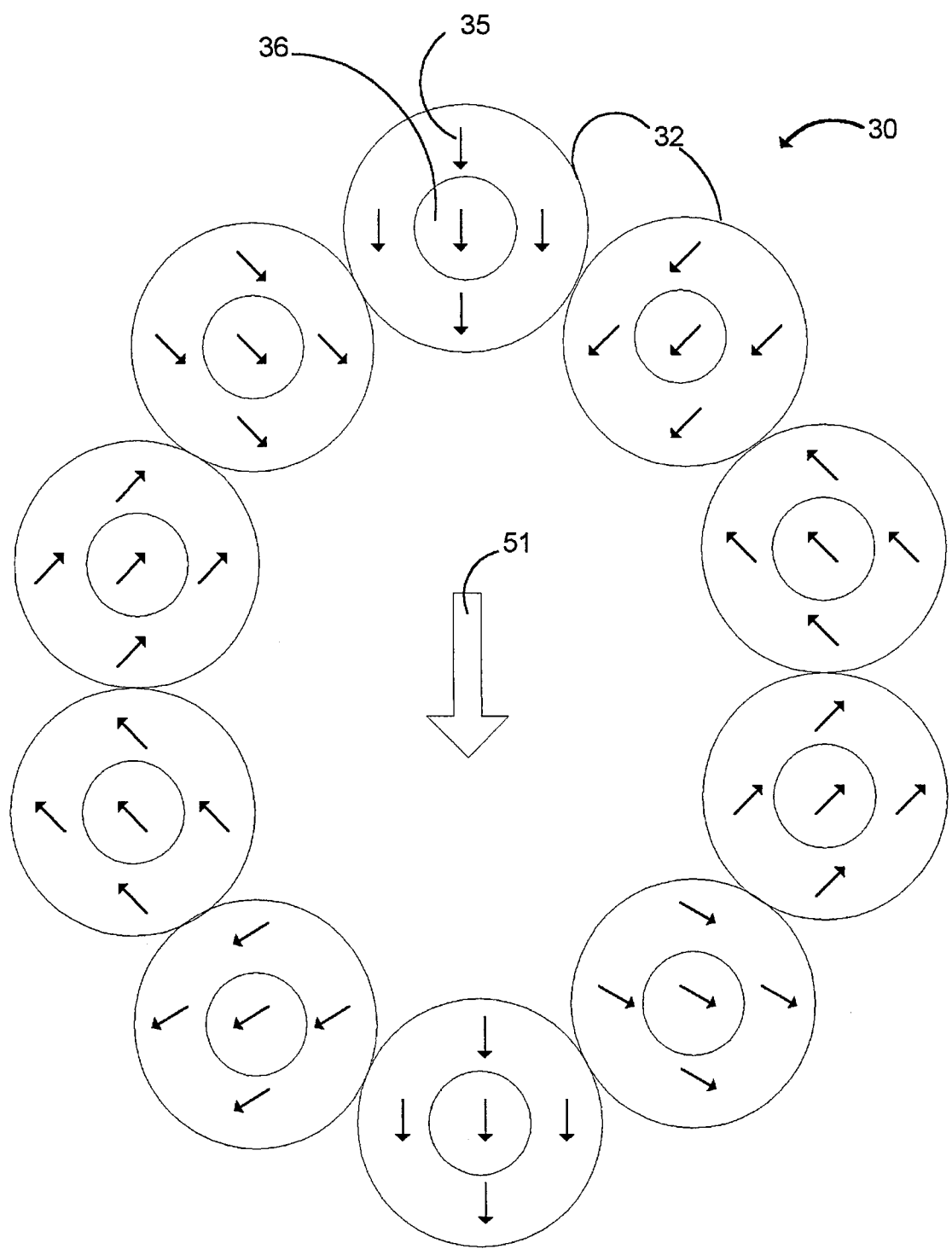
FIG. 4 is a cross-sectional view of an embodiment of the invention configured as a magic ring approximation.
Figure 5:
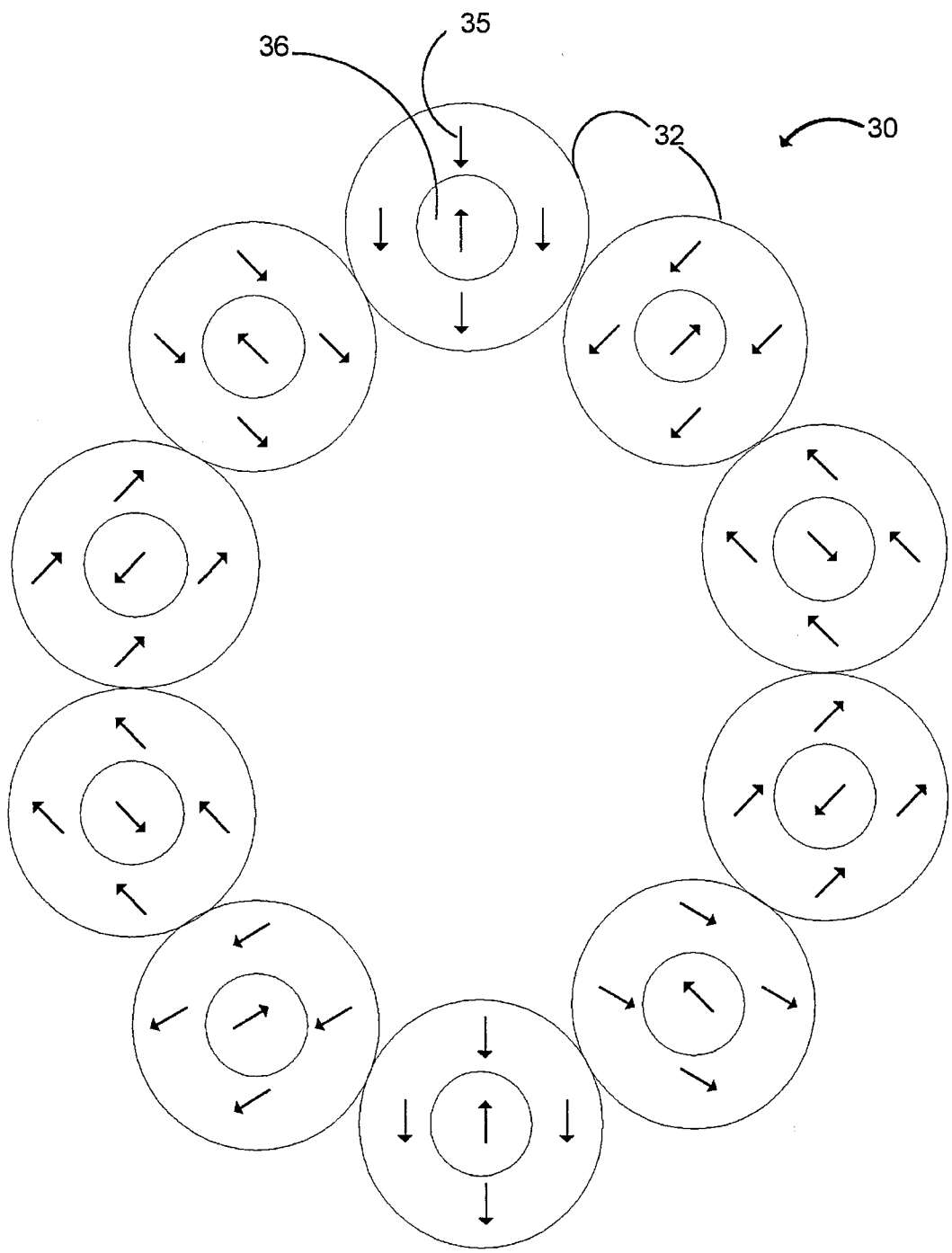
FIG. 5 is a cross-sectional view of an embodiment of the invention wherein the internal working field is negligible.

For example, when cylinders 35 and 36 of each flux source 32 of magic ring 30 have equal magnetic moments, and each cylinder 35 points in the opposite direction of its respective cylinder 36 then, by vector addition, internal working field 51 is essentially negligible. See FIG. 5. If, however, cylinders 35 and 36 of all flux sources 32 are aligned such that their respective discrete fields 40 are aligned as the fixed moments in a magic ring approximation, then working field 51 will be a uniform field having a maximized magnitude for that given set of cylinders 35 and 36. See FIG. 4. In addition, cylinders 35 and 36 of each flux source 32 can be tuned to generate an internal working field having any magnitude or direction between these minimum and maximum levels.

Figure 6:
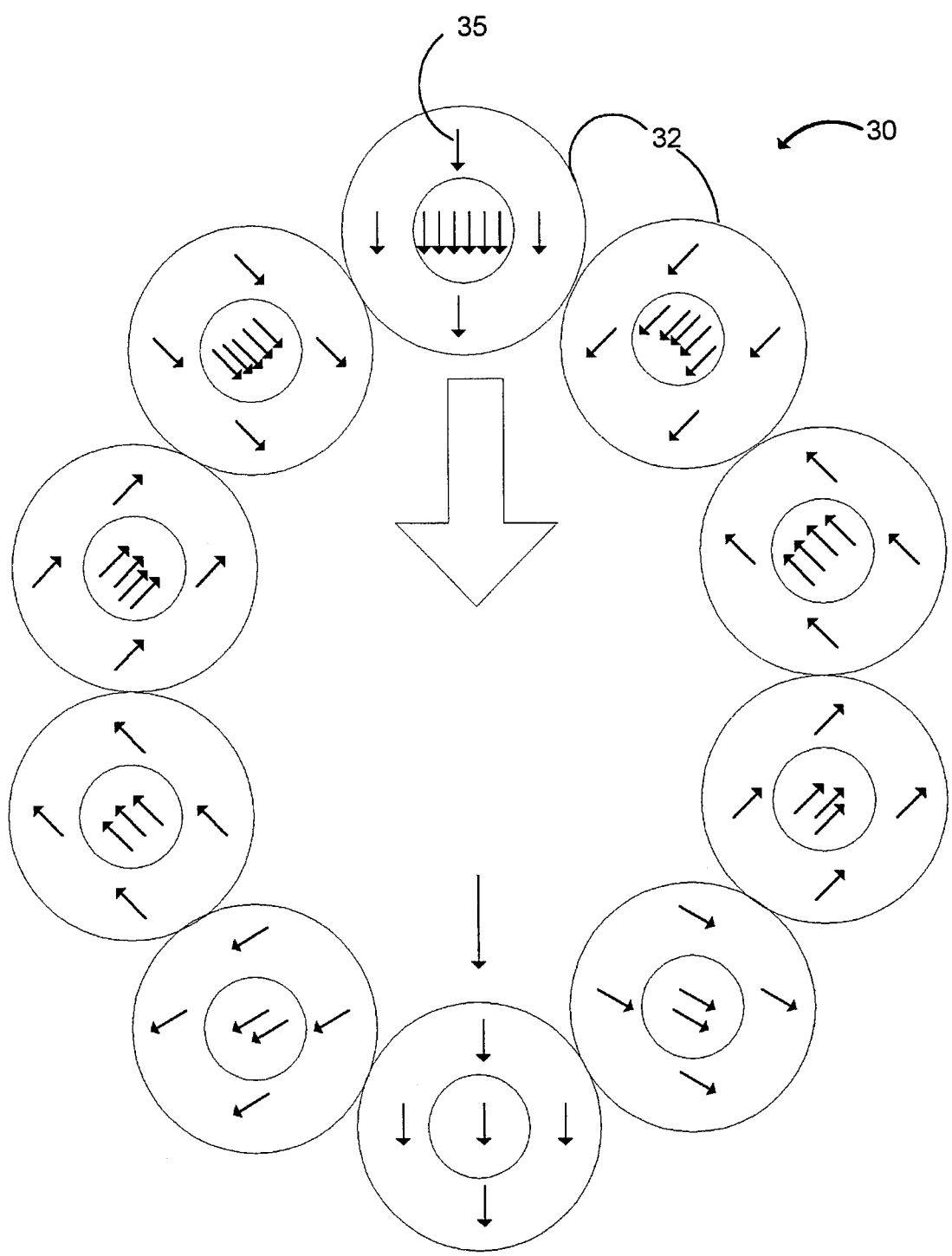
FIG. 6 is a cross-sectional view of an embodiment of the invention wherein the internal working field is variable or gradient.

Moreover, depending on the magnetic moment of cylinders 35 and 36, the flux sources can be tuned to generate an internal working field having a gradient working field, as opposed to a uniform field, within the internal cavity. See FIG. 6. Consequently, the magic ring of the present invention provides a tunable or adjustable internal working field that is more versatile and useful for a diverse range of applications without the cost and difficulty of building permanent magnet shells having many different remanences. Rather, the present invention utilizes uniformly and transversely magnetized permanent magnets which are much easier to make and work with. Thus, overcoming to a large extent the limitations associated with the prior art.

What is claimed is:

1. A magnetic structure providing a magnetic working field having an adjustable magnitude and direction within an internal cavity, comprising:

a shell having a predetermined number of tunable flux sources positioned in relation to each other to form the internal cavity, each said flux source generating a discrete tunable magnetic field for forming the internal working field;

each said flux source having a plurality of concentric, uniformly and transversely magnetized permanent magnet cylinders for generating each said discrete tunable magnetic field, said concentric cylinders having a common longitudinal axis around which said concentric cylinders rotate with respect to each other to tune the magnitude and direction of the working magnetic field within the internal cavity.

2. The magic ring of claim 1 wherein the internal cavity is cylindrical.

3. The magic ring of claim 1 wherein said plurality of concentric cylinders is a first cylinder positioned within a second cylinder.

4. The magic ring of claim 3 wherein said first cylinder is a magic ring and said second cylinder is a uniformly magnetized cylindrical shell.

5. The magnetic structure of claim 1 wherein the internal working field is substantially uniform.

6. The magnetic structure of claim 1 wherein the working field varies as a function of location within the internal cavity.

\* \* \* \* \*